(12) United States Patent
Hu et al.

(10) Patent No.: US 9,063,196 B2
(45) Date of Patent: Jun. 23, 2015

(54) SLOW MAGIC ANGLE SPINNING NUCLEAR MAGNETIC RESONANCE DEVICE AND PROCESS FOR METABOLOMICS PROFILING OF TISSUES AND BIOFLUIDS

(75) Inventors: Jian Zhi Hu, Richland, WA (US); Ju Feng, Richland, WA (US); Hardeep S. Mehta, Kennewick, WA (US)

(73) Assignee: BATTELLE MEMORIAL INSTITUTE, Richland, WA (US)

( * ) Notice: Subject to any disclaimer, the term of this patent is extended or adjusted under 35 U.S.C. 154(b) by 707 days.

(21) Appl. No.: 13/433,038

(22) Filed: Mar. 28, 2012

(65) Prior Publication Data
US 2013/0257432 A1    Oct. 3, 2013

(51) Int. Cl.
*G01V 3/00* (2006.01)
*G01R 33/30* (2006.01)
*G01R 33/465* (2006.01)

(52) U.S. Cl.
CPC ............. *G01R 33/307* (2013.01); *G01R 33/30* (2013.01); *G01R 33/465* (2013.01)

(58) Field of Classification Search
CPC ............................... G01R 33/20; G01R 33/30
USPC ......................................... 324/321, 318, 322
See application file for complete search history.

(56) References Cited

U.S. PATENT DOCUMENTS

| | | | |
|---|---|---|---|
| 6,653,832 B2 | 11/2003 | Wind et al. | |
| 6,670,811 B2 | 12/2003 | Wind et al. | |
| 6,836,115 B2 | 12/2004 | Wind et al. | |
| 6,989,674 B2 * | 1/2006 | Wind et al. | 324/321 |
| 8,106,657 B2 * | 1/2012 | Sakellariou et al. | 324/321 |
| 8,779,768 B2 * | 7/2014 | Brey et al. | 324/307 |
| 2013/0307543 A1 * | 11/2013 | Endo, Yuki | 324/321 |

OTHER PUBLICATIONS

Antzutkin, O. N., et al., Two-Dimensional Sideband Separation in Magic-Angle-Spinning NMR, Journal of Magnetic Resonance, Series A 115, 1995, pp. 7-19.
Wind, R. A., et al., High Resultion 1H NMR Spectroscopy in Organs and Tissues Using Slow Magic Angle Spinning, Magnetic Resonance in Medicine, 46, 2001, pp. 213-218.
Janssen, H., et al., Microcoil High-Resolution Magic Angle Spinning NMR Spectroscopy, Journal of American Chemical Society, 128, 2006, pp. 8722-8723.
Sakellariou, D., et al., High-resolution, high-sensitivity NMR of nanolitre anisotropic samples by coil spinning, Nature, 447, 2007, pp. 694-698.
Hung, I., et al., On the magic-angle turning and phase-adjusted spinning sidebands experiments, Journal of Magnetic Resonance, 204, 2010, pp. 150-154.
Hu. J. Z., et al., Metabolomics in Lung Inflammation: A High-Resolution 1H NMR Study of Mice Exposed to Silica Dust, Toxicology Mechanisms and Methods, 18, 2008, 385-398.

(Continued)

*Primary Examiner* — Louis Arana
(74) *Attorney, Agent, or Firm* — James D. Matheson

(57) ABSTRACT

A slow Magic-Angle Spinning NMR device and method are detailed that provide high resolution and high sensitivity metabolic profiling of biological samples. A new $^1$H-PASS sequence suppresses line broadening in the various biological samples. The device and method allow metabolic changes in small animals to be tracked through continuous investigations of minimally-invasive blood and tissue biopsy samples over a sustained period and allow intact biological objects with sizes up to a few centimeters to be studied.

17 Claims, 7 Drawing Sheets

(56) References Cited

OTHER PUBLICATIONS

Wind, R. A., et al., Slow-MAS NMR: A new technology for in vivo metabolomic studies, Drug Discovery Today: Technologies, 2, 2006, 291-294.

Hu, J. Z., et al., A Simple Approach for Obtaining High Resolution, High Sensitivity 1H NMR Metabolite Spectra of Biofluids with Limited Mass Supply, Proceedings of the 2006 International Conference on Bioinfomatics and Computational Biology, Arabnia HR and Valafar H. (Edts.), CSREA Press, 2006, 360-366.

Hu, J. Z., et al., Magic-Angle-Turning Experiments for Measuring Chemical-Shift-Tensor Principal Values in Powdered Solids, Journal of Magnetic Resonance, A 113, 1995, 210-222.

Wind, R. A., et al., Localized In Vivo Isotropic-Anisotropic Correlation 1H NMR Spectroscopy Using Ultraslow Magic Angle Spinning, Magnetic Resonance in Medicine, 55, 2006, 41-49.

Antzutkin, O. N., et al., Two-Dimensional Sideband Separation in Magic-Angle-Spinning NMR, Journal of Magnetic Resonance, A 115, 1995, 7-19.

Taylor, J. L., et al., High-Resolution Magic Angle Spinning Proton NMR Analysis of Human Prostate Tissue With Slow Spinning Rates, Magnetic Resonance in Medicine, 50, 2003, 627-632.

Maguire, Y., et al., Ultra-small-sample molecular structure detection using microslot waveguide nuclear spin resonance, PNAS, 104, 2007, 9198-9203.

Schlotterbeck, G., et al., High-Resolution Capillary Tube NMR. A miniaturized 5-•Lhigh-sensitivity TXI probe for mass-limitted samples, off-line LC NMR, and HT NMR, Analytical Chemistry, 74, 17 , 2002, 4464-4471.

Price, K. E., et al., Tissue targeted metabonomics: Metabolic profiling by microdialysis sampling and microcoil NMR, Journal of Pharmaceutical and Biomedical Analysis, 38, 2005, 904-909.

Hoult, D. I., et al., The Signal-to-Noise Ratio of the Nuclear Magnetic Resonance Experiment, Journal of Magnetic Resonance, 24, 1976, 71-85.

Stringer, J. A., et al., Reduction of RF-induced sample heating with a scroll coil resonantor structure for solid-state NMR probes, Journal of Magnetic Resonance, 173, 2005, 40-48.

Grant, C. V., et al., An efficient 1H/31P double-resonance solid-state NMR probe that utilizes a scroll coil, Journal of Magnetic Resonance, 188, 2, 2007, 279-284.

Inukai, M., et al., Double-resonance magic angle coil spinning, Journal of Magnetic Resonance, 202, 2, 2010, 274-278.

Hung, I., et al., On the magic-angle turning and phase-adjusted spinning sidebands experiments, Journal of Magnetic Resonance, 204, 2010, 150-154.

Wong, A., et al., Slow Magic-Angle Coil Spinning: A High-Sensitivity and High-Resolution NMR Strategy for Microscopic Biological Specimens, Magnetic Resonance in Medicine, 63, 2010, 269-274.

Ausand, M., et al., Quantitative high-resolution 13C and 1H nuclear magnetic resosnsace of 3 fatty acids from white muscle of Atlantic salmon (salmo salar), JAOCS, 70, 10, 1993, 971-981.

Simopolous, A. P., Omega-3 Fatty Acids in Inflammation and Autoimmune Diseases, Journal of the American College of Nutrition, 21, 6, 2002, 495-505.

Griffin, J. L., et al., Choline containing metabolites during cell transfection: an insight into magnetic resonance spectroscopy detectable changes, FEBS Letters, 509, 2001, 263-266.

Borkman, M., et al., The relation between insulin sensitivity and the fatty-acid composition of skeletal-muscle phospholipids, The New England Journal of Medicine, 328, 1993, 238-244.

Bays, H., et al., Mechanisms of Endocrine Disease, Role of the Adipocyte, Free Fatty Acids, and Ectopic Fat in Pathogenesis of Type 2 Diabetes Mellitus: Peroxisomal Proliferator-Activated Receptor Agonists Provide a Rational Therapeutic Approach, The Journal of Clinical Endocrinology & Metabolism, 82, 2, 2008, 463-478.

Atherton, H. J., et al., . A combined 1H NMR spectroscopy—and mass spectrometry-based metabolomic study of the PPAR-null mouse defines profound systemic changes in metabolism linked to the metabolic syndrome, Physiol Genomics, 27, 2006, 178-186.

Gipson, G. T., et al., Weighted least-squares deconvolution method for discovery of group differences between complex biofluid 1H NMR spectra, Journal of Magnetic Resonance, 183, 2006, 269-277.

Weljie, A. M., et al., Targeted Profiling: Quantitative Analysis of 1H NMR Metabolomics Data, Analytical Chemistry, 78, 13, 2006, 4430-4442.

Webb-Robertson, B. J. M., et al., A Study of spectral integration and normalization in NMR-based metabonomic analyses, Journal of Pharmaceutical and Biomedical Analysis, 39, 2005, 830-836.

Gao, D., et al., Oxidative DNA damage and DNA repair enzyme expression are inversely related in murine models of fatty liver disease, Am. J. Physiol. Gastrointest. Liver Physiol., 287, 2004, G1070-G1077.

Talior, I., et al., PKC-δ-dependent activation of oxidative stress in adipocytes of obese and insulin-resistant mice: role for NADPH oxidase, Am. J. Physiol. Endocrinol. Metab., 288, 2005, E405-E411.

Molnar, J., et al., Diabetes Induces Endothelial Dysfunction but Does Not Increase Neointimal Formation in High-Fat Diet Fed C57BL/6J Mice, Circ. Res., 96, 2005, 1178-1184.

Wind, R. A., et al., Magnetic susceptibility effects in nuclear magnetic resonance spectroscopy of biological objects, Recent Research Developments in Magnetism & Magnetic Materials, vol. 1, Pandalai SG Edt., 2003, 147-169.

Wind, R. A., et al., Proton NMR in Biological Objects Subjected to Magle Angle Spinning, Encyclopedia of Analytical Science, Second Edition, Paul J. Worsfold, Alan Townshend and Colin F. Poole, edts), Elsevier, Oxford, vol. 6, 2005, 333-342.

Hu, J. Z., et al., An Isotropic Chemical Shift—Chemical Shift Anisotropy Magic-Angle Slow-Spinning 2D NMR Experiment, Journal of Magnetic Resonance, A 105, 1993, 82-87.

Wind, R. A., et al., High Resolution 1H NMR Spectroscopy in Organs and Tissues Using Slow Magic Angle Spinning, Magn. Reson. Med., 46, 2001, 213-218.

Fiehn, O., Combining genomics, metabolome analysis, and biochemical modelling to understand metabolic networks, Comparative and Functional Genomics, 2, 2001, 155-168.

Nicholson, J. K, et al., 'Metabonics': understanding the metabolic responses of living systems to pathophysiological stimuli via multivariate statistical analysis of biological NMR spectroscopic data, Xenobiotica, 29, 11, 1999, 1181-1189.

Lindon, J. C., et al., Metabonomics: Metabolic Processes Studied by NMR Spectroscopy of Biofluids, Concepts of Magnetic Resonance, 12, 2000, 289-320.

Lindon, J. C., et al., Pattern recognition methods and applications in biomedical magnetic resonance, Progress in Nuclear Magnetic Resonance Spectroscopy, 39, 2001, 1-40.

Lindon, J. C., et al., So what's the deal with Metabonomics? Metabonomics measures the fingerprint of biochemical perturberations caused by disease, drugs, and toxins, Analytical Chemistry, 75, 2003, 384A-391A.

Lindon, J. C., et al., Toxicological applications of magnetic resonance, Progress in Nuclear Magnetic Resonance Spectroscopy, 45, 2004, 109-143.

Reo, N. V., NMR-Based Metabolomics, Drug and Chemical Toxicology, 25, 4, 2002, 375-382.

Bollard, M. E., NMR-based metabonomic approaches for evaluating physiological influences on biofluid composition, NMR in Biomedicine, 18, 2005, 143-162.

Nicholson, J. K., et al., High Resolution Proton Magnetic Resonance Spectroscopy of Biological Fluids, Progress in NMR Spectroscopy, 21, 1989, 449-501.

Dunn, W. B., et al., Metabolomics: Current analytical platforms and methodologies, Trends in Analytical Chemistry, 24, 4, 2005, 285-294.

Griffin, J. L., The Cinderalla story of metabolic profiling: does metabolomics get to go to the functional genomics ball?, Phil. Trans. R. Soc., B. 361, 2006, 147-161.

Griffin, J. L., et al., A metabolomics perspective of human brain tumours, FEBS Journal, 274, 2007, 1132-1139.

Waters, N. J., et al., NMR and Pattern Recognition Studies on the Time-Related Metabolic Effects of a-Naphthylisothiocyanate on Liver, Urine, and Plasma in the Rat: An Inetgrative Metabonomic Approach, Chem. Res. Toxicol., 14, 2001, 1401-1412.

(56) References Cited

OTHER PUBLICATIONS

Coen, M., et al., An Integrated Metabonomic Investigation of Acetaminophen Toxicity in the Mouse Using NMR Spectroscopy, Chem. Res. Toxicol., 16, 2003, 295-303.

Holmes, E., et al., Automatic Data Reduction and Pattern Recognition Methods for Analysis of 1H Nuclear Magnetic Resonance Spectra of Human Urine from Normal and Pathological States, Analytical Biochemistry, 220, 194, 284-296, (1994).

Bollard, M. E., High-Resolution 1H and 1H-13C Magic Angle Spinning NMR Spectroscopy of Rat Liver, Magnetic Resonance in Medicine, 44, 2000, 201-207.

Andrew, E. R., Removal of dipolar broadening of NMR spectra of solids by specimen rotation, Nature, 183, 1969, 1802-1803.

Garroway, A. N., Magic-Angle Sample Spinning of Liquids, Journal of Magnetic Resonance, 49, 1982, 168-171.

Cheng, L. L, et al., Quantitative neuropathology by high resolution magic angle spinning proton magnetic resonance spectroscopy, Proc. Natl. Acad. Sci. USA, 94, 1997, 6408-6413.

Chen, J., et al., Biochemical Analysis Using High-Resolution Magic Angle Spinning NMR Spectroscopy Distinguishes Lipoma-Like Well-Differentiated Liposarcoma from Normal Fat, J. Am. Chem. Soc., 123, 2001, 9200-9201.

Garrod, S., et al., High-Resolution Magic Angle Spinning 1H NMR Spectroscopic Studies on Intact Rat Renal Cortex and Medulla, Megnetic Resonance in Medicine, 41, 1999, 1108-1118.

Garrod, S., et al., High-Resolution 1H NMR and Magic Angle Spinning NMR Spectroscopic Investigation of the Biochemical Effects of 2-Bromoethanamine in Intact Renal and Hepatic Tissue, Magnetic Resonance in Medicine, 45, 2001, 781-790.

Weybright, P., et al., Gradient, High-resolution, Magic Angle Spinning 1H Nuclear Magnetic Resonance Spectroscopy of Intact Cells, Magnetic Resonance in Medicine, 39, 1998, 337-345.

Griffin, J. L., Metabolic Profiles of Cancer Cells, Nature Reviews Cancer, 4, 2004, 551-561.

Lyng, H., et al., Metabolic mapping by use of high-resolution magic angle spinning 1H MR spectroscopy for assessment of apoptosis in cervical carcinomas, BMC Cancer 7, 2007, 1-12.

Sitter, B., et al., Cervical cancer tissue characterized by high-resolution magic angle spinning MR spectroscopy, Magma, 16, 2004, 174-181.

Sitter, B., et al., Comparison of HR MAS MR spectroscopic profiles of breast cancer tissue with clinical parameters, NMR BioMed, 19, 2006, 30-40.

Sitter, B., et al., High-resolution magic angle spinning MRS of breast cancer tissue, NMR in Biomedicine, 15, 2002, 327-337.

Chen, L. L., et al., Non-destructive quantitation of spermine in human prostate tissue samples using HRMAS 1H NMR spectroscopy at 9.4 T, FEBS Letters, 494, 2001, 112-116.

Zektzer, A. S., et al., Improved Signal to Noise in High-Resolution Magic Angle Spinning Total Correlation Spectroscopy Studies of Prostate Tissues Using Rotor Synchronized Adiabatic Pulses, Magnetic Resonance in Medicine, 53, 2005, 41-48.

Wu, C., et al., Proton High-Resolution Magic Angle Spinning NMR Analysis of Fresh and Previously Frozen Tissue of Human Prostate, Magnetic Resonance in Medicine, 50, 2003, 1307-1311.

Valonen, P. K. et al., High-resolution magic-angle-spinning 1H NMR spectroscopy reveals different responses in choline-containing metabolites upon gene therapy-induced programmed cell death in rat brain glioma, NMR in Biomedicine, 18, 2005, 252-259.

Lehtimaki, K. K., et al., Metabolite Changes in BT4C Rat Gliomas Undergoing Ganciclovir-Thymidine Kinase Gene Therapy-induced Programmed Cell Death as Studied by 1H NMR Spectroscopy in Vivo, ex Vivo, and in Vitro, The Journal of Biomedical Chemistry, 278, 2003, 45916-45923.

Barton, S. J., et al., Comparison of in vivo 1H MRS of human brain tumours with 1H HR-MAS spectroscopy of intact biopsy samples in vitro, Magnetic Resonance Materials in Physics, Biology and Medicine, 8, 1999, 121-128.

Sitter, B., et al., High-Resolution Magic Angle Spinning and 1H Magnetic Resonance Spectroscopy Reveal Significantly Altered Neuronal Metabolite Profiles in CLN1 but Not in CLN3, Journal of Neuroscience Research, 77, 2004, 762-769.

Holmes, E., et al., The Application of NMR-Based Metabonomics in Neurological Disorders, The Journal of the American Society for Experimental Neuro Therapeutics, 3, 2006, 358-372.

Wang, Y., et al., Spectral editing and pattern recognition method applied to high-resolution magic-angle spinning 1H nuclear magnetic resonance spectroscopy of liver tissues, Analytical Biochemistry, 323, 2003, 26-32.

Wang, Y., et al., Topographical Variation in Metabolic Signatures of Human Gastrointestinal Biopsies Revealed by High-Resolution Magic-Angle Spinning 1H NMR Spectroscopy, Journal of Proteome Research, 6, 2007, 3944-3951.

Griffin, J. L., et al., The biochemical p;rofile of rat testicular tissue as measured by magic angle spinning 1H NMR spectroscopy, FEBS Letters, 486, 2000, 225-229.

Janssen, H., et al., Microcoil High-Resolution Magic Angle Spinning NMR Spectroscopy, J. Am. Chem. Soc., 128, 2006, 8722-8723.

Sakellariou, D., et al., High-resolution, high-sensitivity NMR of nanolitre anisotropic samples by coil spinning, Nature, 447, 2007, 694-698.

Wind, R. A., et al, High-Resolution 1H NMR Spectroscopy in Organs and Tissues Using Slow Magic Angle Spinning, Magnetic Resonance in Medicine, 49, 2006, 207-259.

Wind, R. A., In vivo and ex viv resolution 1H NMR in biological systems using low-speed magic angle spinning, Progress in Nuclear Magnetic Resonance Spectroscopy, 49, 2007, 207-259.

Hu, J. Z., et al., High-resolution 1H NMR Spectroscopy in Rat Liver Using Magic Angle Turning at 1Hz Spinning Rate, Magnetic Resonance in Medicine, 47, 2002, 829-836.

Wind, R. A., et al, High-Resolution 1H NMR Spectroscopy in a Live Mouse Subjected to 1.6 Hz Magic Angle Spinning, Magnetic Resonance in Medicine, 50, 2003, 1113-1119.

Hu, J. Z., et al., The evaluation of different MAS techniques at low spinning rates in aqueous samples and in the presence of magnetic susceptibility gradients, Journal of Magnetic Resonance, 159, 2002, 92-100.

Hu, J. Z., et al., Sensitivity-enhanced pahse-corrected ultra-slow magic angle turning using multiple-echo data acquisition, Journal of Magnetic Resonance, 163, 2003, 149-162.

Hu., J. Z., et al., 1H relaxation times of metabolites in biological samples obtained with nondestructive ex-vivo slow-MAS NMR, Magnetic Resonance in Chemistry, 44, 2006, 269-275.

Hu, J. Z., et al., High-resolution 1H NMR Spectroscopy of Metabolically Active Microorganisms Using Non-Destructive Magic Angle Spinning, Spectroscopy, 29 (12), 2004, 98-102.

Bertram, H. C., et al., Dynamic High-Resolution 1H and 31P NMR Spectroscopy and 1H T2Measurements in Postmorten Rabbit Muscles Using Slow Magic Angle Spinning, J. Agric. Food. Chem., 52, 2004, 2681-2688.

\* cited by examiner

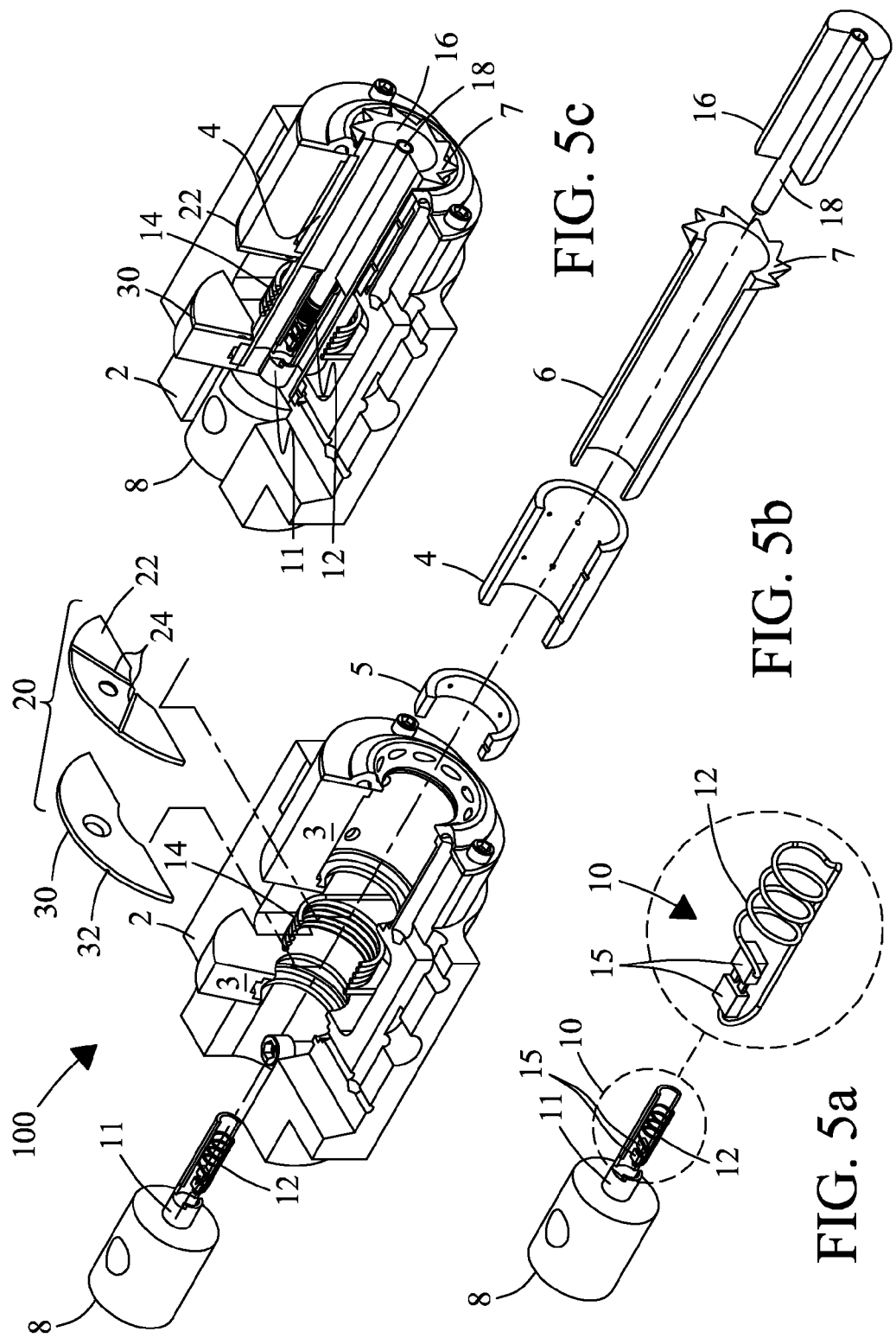

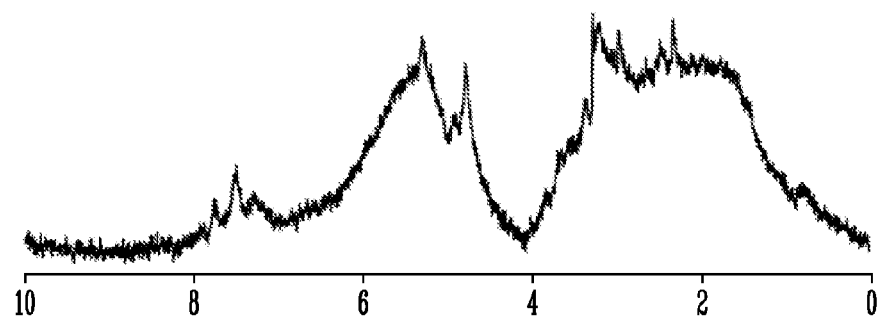
FIG. 9a
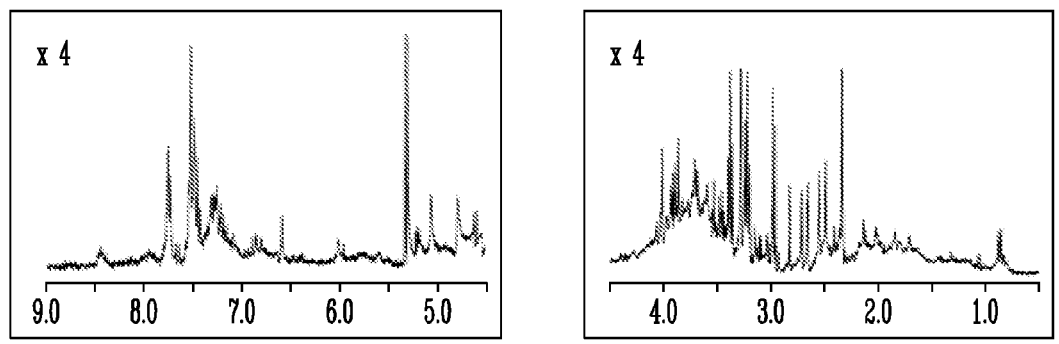
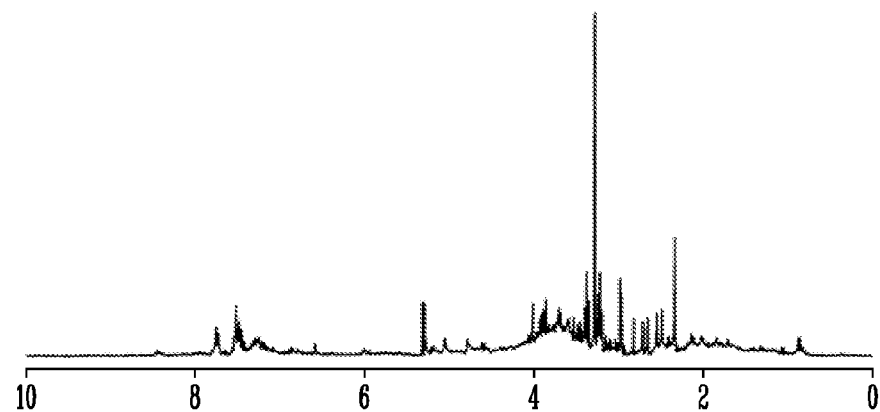
FIG. 9b

SLOW MAGIC ANGLE SPINNING NUCLEAR MAGNETIC RESONANCE DEVICE AND PROCESS FOR METABOLOMICS PROFILING OF TISSUES AND BIOFLUIDS

This invention was made with Government support under contract number R01ES022176 awarded by the U.S. National Institute of Environmental Health Sciences (NIEHS) and contract number R21 RR025785 awarded by the U.S. National Center for Research Resources (NICRR), both agencies of the National Institutes of Health (NIH). The Government has certain rights in the invention.

FIELD OF THE INVENTION

The present invention relates generally to magic angle spinning (MAS) spectroscopy. More particularly, the present invention relates to a nanoliter magic angle spinning probe for metabolomics analyses in nuclear magnetic resonance spectroscopy.

BACKGROUND OF THE INVENTION

Metabolomics is the study of the chemical fingerprints or metabolites associated with various chemical processes occurring within tissues and fluids of various biological organisms. These chemical fingerprints are a result of specific cellular processes that leave behind specific metabolic, or small-molecule metabolite, profiles. The metabolome is the collection of all metabolites in a biological cell, tissue, organ, or organism. These metabolites are the end products of these various cellular processes.

Nuclear Magnetic Resonance (NMR) spectroscopy is a quantitative, non-destructive method that requires no, or minimal, sample preparation and is one of the leading analytical tools for metabonomics (metabolomics) research. $^1$H NMR is especially attractive because protons are present in virtually all metabolites and their NMR sensitivity is high, enabling simultaneous identification and monitoring of a wide range of low molecular weight metabolites and provide a biochemical fingerprint of an organism. However, the resolution of the $^1$H NMR spectra from tissues is often poor due to magnetic susceptibility variations, as well as other residual proton dipolar coupling and residual chemical shift anisotropy interactions. Further, MAS typically requires tissue samples of between 10 mg and 40 mg, or volumes of a few μL, or more, for standard metabolic profiling, which limits possible applications. Often small animals need to be sacrificed to obtain adequate amounts of tissues or blood for analysis. This makes it difficult or impossible to carry out continuous studies on single animals over a long period of time. And, changes to metabolite biomarkers due to normal biological variations often requires a large number of animals in order to provide sufficient biostatistical data, making metabolomics investigations expensive. The unique ability of MAS to analyze intact tissue samples eliminates the extraction process, which is a major breakthrough in metabolomics, not only because the extraction takes time, but also because metabolites can be lost during the extraction process. The MAS technique generates a high resolution $^1$H NMR metabolite spectrum of tissue samples with spectral resolution approaching that obtained from standard liquid-state NMR on cell and tissue extracts. And, various line broadening mechanisms can be eliminated at a sample spinning rate of several kHz or more. Recently, several new miniaturization approaches have been introduced in the art that report to decrease sample sizes for the MAS technique. However, various weaknesses have been identified in these approaches including, e.g., coil designs that induce line broadening and seriously reduce sensitivity at low spinning rates of current interest, suitability for solid-state analyses only, and other demonstrated weaknesses.

Accordingly, new devices and methods are needed that address various problems known in the art, and can perform metabolic profiling on small intact biological samples so that non-invasive and/or minimally invasive detection and analyses are possible. The present invention addresses these needs. Additional advantages and novel features of the present invention will be set forth as follows and will be readily apparent from the descriptions and demonstrations set forth herein. Accordingly, the following descriptions of the present invention should be seen as illustrative of the invention and not as limiting in any way.

SUMMARY OF THE INVENTION

A slow Magic Angle Spinning (MAS) probe is described for high resolution $^1$H Nuclear Magnetic Resonance (NMR) metabolic (metabolomics) profiling of a sample. The probe is configured to rotate the sample inclined at a magic angle with respect to the $B_0$ magnetic field at a slow spinning rate. The probe has a sample spinning rotor that includes a sample tube adapter configured to hold sample tubes of varied dimensions that contain samples of a variable size, quantity, and/or volume in the rotor when introduced into a support body (stator) of the probe. The probe also has a switchable LC resonator that includes a first static RF coil coupled to one or more capacitors that defines an RF circuit. The switchable LC resonator may attach to a switchable plug component that inserts into the support body of the probe. The LC resonator when inserted in the support body inductively couples the first static RF coil to a second static RF coil positioned within the support that enhances the sample filling factor between the sample and the first RF coil and the sensitivity of samples analyzed therein.

A method is also described for performing slow-MAS spectroscopy. The method may include spinning a sample in a slow-MAS sample spinning rotor within a sample spinning probe. The probe is inclined at a magic angle with respect to the $B_0$ magnetic field and spins the sample at a slow spinning rate. The method may further include acquiring NMR data using a slow-MAS $^1$H Phase Adjusted Spinning Sidebands (PASS) pulse sequence that includes a rotor position synchronization segment to suppress magnetic susceptibility line broadening effects in the sample at the slow MAS spinning rate.

The probe is configured to rotate the sample at a slow spinning rate below about 500 Hz.

In some embodiments, the first static RF coil circumvolves the sample tube in the rotor.

In various embodiments, the switchable LC resonator and first static RF coil are switchable with an LC resonator and static RF coil of a smaller or larger width dimension to accommodate a sample tube with a smaller or larger width dimension in the rotor.

In some embodiments, the sample tube adapter may be composed of a machinable plastic. In some embodiments, the switchable plug may be composed of a machinable plastic.

In some embodiments, the probe includes a single rotation bearing.

In some embodiments, the probe includes dual rotation bearings. In some embodiments, the first rotation bearing is located in the support body in front of the second RF coil to support the sample tube when inserted into the rotor. In some embodiments, the second rotation bearing is located at the rear of the second RF coil in the support body where the switchable plug attached to the LC resonator and first static RF coil insert into the support body of the probe. The second rotation bearing may be included to support a sample tube containing a heavy sample when inserted into the rotor.

In some embodiments, the probe includes an optical detection system with a first optical detection channel on a support that includes a first optical fiber. The first optical fiber may count and determine spinning rate of the rotor. In some embodiments, the first optical fiber determines spinning rate in concert with a number of counting marks located on a surface of the rotor during rotation of the rotor. In various embodiments, number of counting marks on the surface of the rotor is any multiple of 6 below and including 24. The number of counting marks may be selected based on the desired accuracy for the spinning rate measurement.

In some embodiments, the optical detection system includes a second optical detection channel on a support with a second optical fiber that synchronizes a slow MAS pulse sequence to a specified rotor position. In some embodiments, the second optical fiber synchronizes rotor position in concert with a $^1$H Phase Adjusted Spinning Sidebands (PASS) pulse sequence that includes a rotor position synchronization sequence segment therein. In some embodiments, the second optical fiber synchronizes rotor position with optical triggering based on a single fixed mark disposed on a surface of the rotor during rotation of the rotor. In various embodiments, the pulse sequence suppresses magnetic susceptibility induced line broadening effects for the sample at the slow spinning rate. In some embodiments, the pulse sequence controls timing of pulses delivered by the pulse sequence.

In some embodiments, acquiring NMR data includes optically synchronizing the rotor position with the timing of the pulse sequence. In some embodiments, acquiring NMR data includes use of a selected MAT or MATPASS pulse sequence or segment. In some embodiments, the acquiring includes optically triggering the pulse sequence. In some embodiments, the triggering includes triggering an optical fiber to synchronize the position of the rotor within the sample spinning probe. In some embodiments, the triggering includes detecting a fixed mark on the surface of the rotor.

In some embodiments, the method includes establishing the magic angle of the probe with a KBr sample prior to spinning the sample.

In some embodiments, the sample is a homogeneous sample. In some embodiments, the sample is a non-homogeneous sample. In some embodiments, the non-homogeneous sample is a non-homogeneous tissue sample. In some embodiments, the sample is an intact sample. In some embodiments, the sample is a biofluid sample.

In some embodiments, the method includes generating a high-resolution $^1$H NMR spectrum free of magnetic susceptibility induced line broadening after acquiring NMR data with a PASS sequence.

The purpose of the foregoing abstract is to enable the United States Patent and Trademark Office and the public generally, especially the scientists, engineers, and practitioners in the art who are not familiar with patent or legal terms or phraseology, to determine quickly from a cursory inspection the nature and essence of the technical disclosure of the application. The abstract is neither intended to define the invention of the application, which is measured by the claims, nor is it intended to be limiting as to the scope of the invention in any way.

BRIEF DESCRIPTION OF THE DRAWINGS

FIGS. 5a-5c show another embodiment of a slow-MAS NMR metabolomics probe for metabolic profiling of variable quantities of biological tissues and biofluids samples.

FIGS. 9a-9b show high-resolution slow-MAS $^1$H PASS spectra for a microliter biofluid sample.

DETAILED DESCRIPTION

A slow-MAS NMR probe and method are described that significantly enhance spectral resolution in excised tissues, organs, and live small specimens (e.g., bugs and insects) for metabolomics applications. The following description details a best mode of at least one embodiment of the slow-MAS NMR probe. It will be apparent from the description that various modifications, alterations, and substitutions may be made without departing from the scope of the invention as set forth in the claims listed hereafter, and that the invention also includes a variety of modifications and embodiments thereto. And, while the invention is susceptible of various modifications and alternative constructions, it should be understood, that there is no intention to limit the invention to the specific form disclosed, but, on the contrary, the invention is to cover all modifications, alternative constructions, and equivalents falling within the spirit and scope of the invention as defined in the claims. Accordingly, the present description should be seen as illustrative and not limiting.

Figure 1:
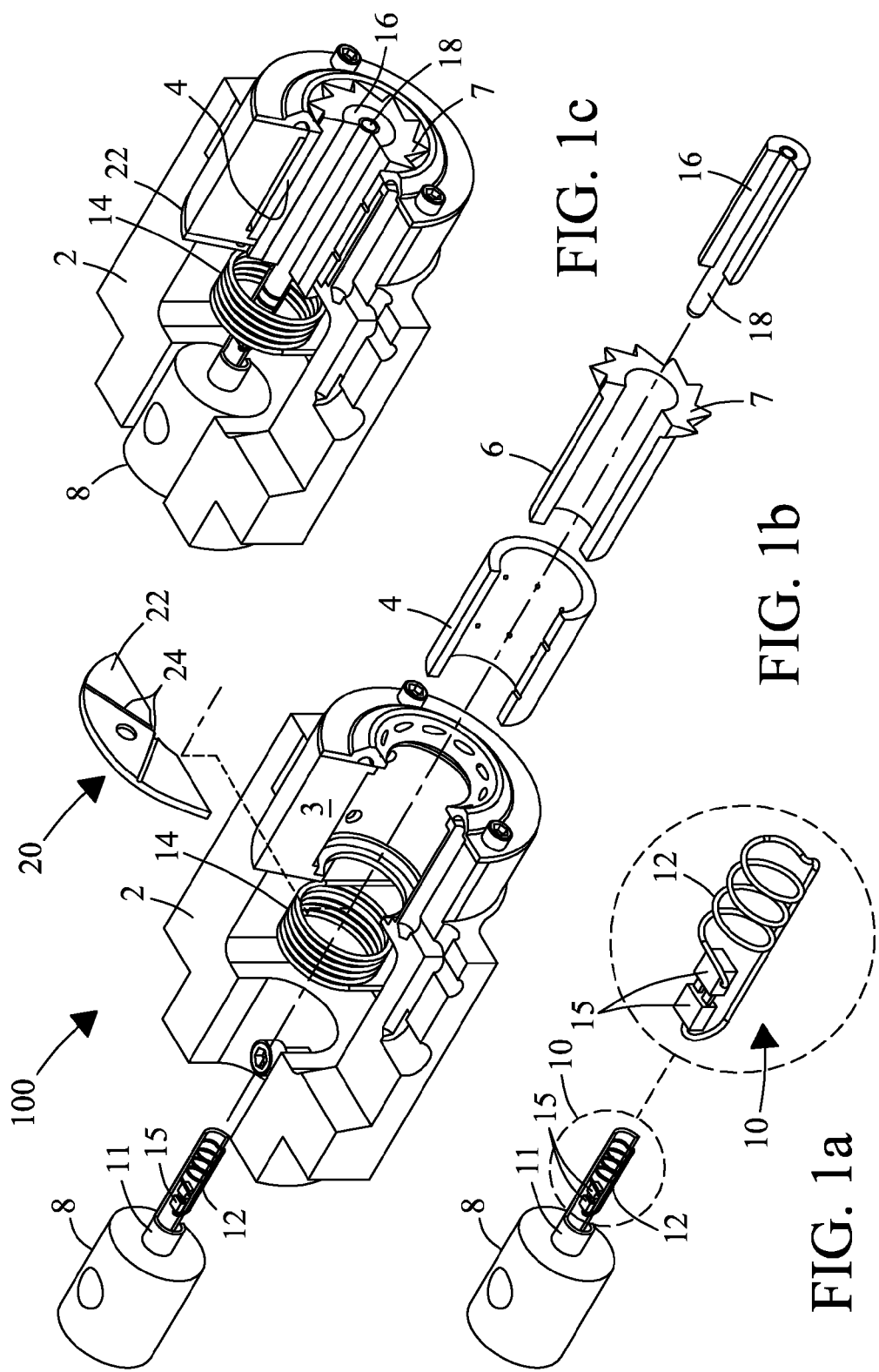
FIGS. 1a-1c show different views of one embodiment of a slow-MAS NMR probe for metabolic profiling of variable quantities of biological tissues and biofluids.

FIGS. 1a-1b show different views of a slow Magic Angle Spinning (MAS) Nuclear Magnetic Resonance (NMR) probe 100 for metabolomics profiling of tissues and biofluids samples. "Slow" as the term is used herein means a sample spinning rate below about 500 Hz. In some embodiments, sample spinning rates as low as 40 Hz are employed. In some embodiments, sample spinning rates up to about 300 Hz are employed.

FIG. 1a shows an expanded view of slow-MAS NMR probe 100. Probe 100 includes a probe (stator) body 2, a bearing 4 of a gas-driven type for sample spinning, and a sample spinning rotor 6. Probe 100 also includes a switchable plug 8 with a switchable LC resonator 10 that attaches to switchable plug 8. The term "switchable" as used herein in reference to the slow-MAS device (probe) means that selected components of the probe may be exchanged with a replacement component that has a smaller or larger diameter dimension that allows the probe to accommodate smaller or larger sample tubes and thus quantities and/or volumes of samples.

LC resonator 10 includes an inner static RF coil 12 (e.g., micro-sized coil) positioned at the junction of an LC circuit in LC resonator 10, with capacitors (C) 15 (shown, e.g., as small square blocks) attached at respective ends of RF coil 12 that complete the circuit. Capacitors 15 are positioned such that they generate a minimal magnetic susceptibility gradient across a sample. In some embodiments, capacitors 15 are positioned at one end of RF coil 12 (see FIG. 1b). In some embodiments, capacitors 15 are positioned below RF coil 12. In some embodiments, capacitors 15 are positioned above RF coil 12. No limitations are intended. Inner RF coil 12 may be constructed of a long, thin loop of magnetic susceptibility-matched wire. In an exemplary construction, inner RF coil 12 includes 6 turns of a palladium (Pd)-plated Oxygen-Free High Conductivity (OFHC) copper (Cu) wire. Inner RF coil 12 is placed inside a switchable coil support 11. In some embodiments, inner RF coil 12 includes an inner diameter (I.D.) of 1.3 mm, an outside diameter (O.D.) of 1.7 mm, and a total coil length of ~2.7 mm. In some embodiments, inner RF coil 12 may have an inner diameter (I.D.) as small as 1 mm and a length of 1 mm, depending on the size, volume, or quantity of sample.

Switchable plug 8 and LC resonator support 11 may be composed of a machinable plastic. In some embodiments, LC resonator support 11 is composed of a machinable plastic made of polychlorotrifluoroethylene (PCTFE) homopolymer (e.g., KEL-F®, Ridout Plastics, Inc., San Diego, Calif., USA) or another machinable plastic of sufficient structural strength such that the alignment (i.e., clearance and sample filling factor) between sample tube 18 and inner RF coil 12 is maintained during rotation of the sample. All clearances between sample tube 18 and inner RF coil 12 as will be selected by those of ordinary skill in the art in view of this disclosure are within the scope of the invention. No limitations are intended.

Switchable plug 8 and LC resonator 10 insert together into probe (stator) body 2. When assembled into probe 100 (stator) body 2, inner RF coil 12 couples inductively with an outer static RF excitation/receiver coil (resonator) 14 positioned within probe (stator) body 2. In some embodiments, outer coil 14 includes an I.D. of 12.6 mm, an O.D. of 13.8 mm, and a total coil length of 9 mm. In some embodiments, outer RF coil 14 may be constructed of flat wires with a width up to about 4 mm and a coil length of from about 4 mm to about 15 mm. No limitations are intended. "Inductively coupled" means inner LC resonator 10 does not direct contact outer RF coil 12, or its circuit. Inductive coupling is satisfied when the resonant frequency of the inner LC resonator 10 is within about 10 MHz or less of the resonant frequency of the outer RF coil 12 circuit. Inner RF coil 12 maximizes the "filling factor" (defined as the sample size divided by the volume of the inner RF coil) between sample tube 18 that contains the sample and inner RF-Coil 12, which increases the NMR sensitivity because NMR sensitivity is proportional to the square root of the filling factor. "NMR sensitivity" is defined as the NMR peak height divided by the amplitude of noise. Inner RF coil 12 is static, meaning sample tubes 18 rotate together with MAS rotor 6 while inner RF coil 12 remains stationary.

Probe 100 includes a sample tube adaptor 16 of an adjustable size that holds sample tubes 18 of varied dimensions to accommodate varied quantities and volumes of samples introduced in sample tubes 18 when introduced into sample rotor 6. In operation, the static inner RF coil 12 optimizes the $B_0$ field homogeneity while sample tube 18 spins. Switchable plug 8 into which switchable LC resonator 10 inserts may be exchanged with smaller or larger switchable LC resonators 10 to accommodate inner RF coils 12 with different internal diameters (I.D.). Sample tubes 18 with larger or smaller diameter dimensions can thus be introduced to accommodate larger or smaller volumes, or quantities, of sample. LC resonator 10 containing inner RF coil 12 and associated capacitors 15 may be removed from probe (stator) body 2 when the quantity or volume of sample is sufficient to overcome sensitivity limitations resulting from a limited sample size. Sensitivity limitations depend on the sample quantity or volume and are generally overcome when the tissue volume or sample volume is about 40 mg or more. Above this sample volume, inner RF coil 12 is no longer necessary because sufficient signal is generated to provide a sufficient NMR sensitivity. But, no limitations in sample volumes or sensitivity thresholds are intended.

Sample rotor 6 includes a number of turning fins 7 that spin rotor 6 in concert with a drive gas when rotor 6 is assembled with bearing 4 in probe (stator) body 2. Probe 100 further includes an optical detection system 20 that detects the sample spinning rate of sample rotor 6. Optical detection system 20 includes a mounting support 22 with an optical detection channel 24 that mounts an optical fiber (not shown) at the trailing side of the bearing 4 so as to count the counting marks located on the rear of sample rotor 6 when assembled in stator body 2 in front of RF coil 14. In some embodiments, spinning rate may be accurately determined with a number of counting marks that is any multiple of 6 below and including 24.

FIG. 1b shows a perspective view of a switchable plug 8 with LC resonator 10 attached. LC resonator 10 inserts into resonator support 11. Resonator support 11 may an integrated part of switchable plug 8. Thus, no limitations are intended. Switchable plug 8 is designed to allow use of switchable LC resonators 10 and RF coils 12 of different internal diameters (I.D.) to accommodate sample tubes 18 that have different diameter dimensions for different volumes or quantities of sample. Inner RF coil 12 may be constructed of magnetic susceptibility-matched wire and placed inside switchable coil support 11. Coil support 11 is also exchangeable to accommodate both larger and smaller RF coils that accommodate sample larger or smaller sample quantities or volumes. Inner RF coil 12 is static, meaning sample tubes 18 rotate with MAS rotor 6 while RF coil 12 remains stationary. The static coil 12 optimizes the $B_0$ field homogeneity while sample tube 18 spins.

FIG. 1c shows a perspective view of slow-MAS NMR probe 100 in an assembled form. In the figure, sample tube 18 is positioned inside adaptor 16 and positioned within rotor 6. Rotor 6 includes turning fins 7 that turn rotor 6 in concert with gas-driven bearing 4. In the figure, switchable plug 8 is attached to switchable LC resonator 10 that includes inner static RF coil 12. Switchable plug 8 aligns LC resonator 10 such that inner static RF coil 12 inserts into probe (stator) body 2 and couples inductively with outer static RF excitation/receiver coil (resonator) 14 within probe (stator) body 2 and aligns with sample tube 18 during sample rotation. Inner RF coil 12 produces controlled magnetic fields when an electric current is passed through the coil. Inner RF coil 12 produces a magnetic field when positioned adjacent to, or around a sample tube 18.

In some embodiments, outer RF-coil (resonator) 14 resonates at a $^1H$ Larmor frequency of about 300 MHz, but frequencies are not intended to be limited thereto. In some embodiments, inner RF coil 12 (resonator) resonates at about 298 MHz, but frequencies are not intended to be limited thereto provided the resonant frequency of inner RF coil 12 is sufficiently close (defined at less than about 10 MHz) to that of the outer RF coil 14 circuit. In one exemplary test, when inner RF coil 12 was not installed, pulse width of a 300 MHz $^1H$ π/2 pulse was 12.5 μsec, which was obtained with an RF power input of 28 Watts (W). With the inner RF coil 12 installed, pulse width of the 300 MHz $^1$H $\pi/2$ pulse was 3.75 μsec, obtained with an RF power input of 0.6 W.

Figure 2:
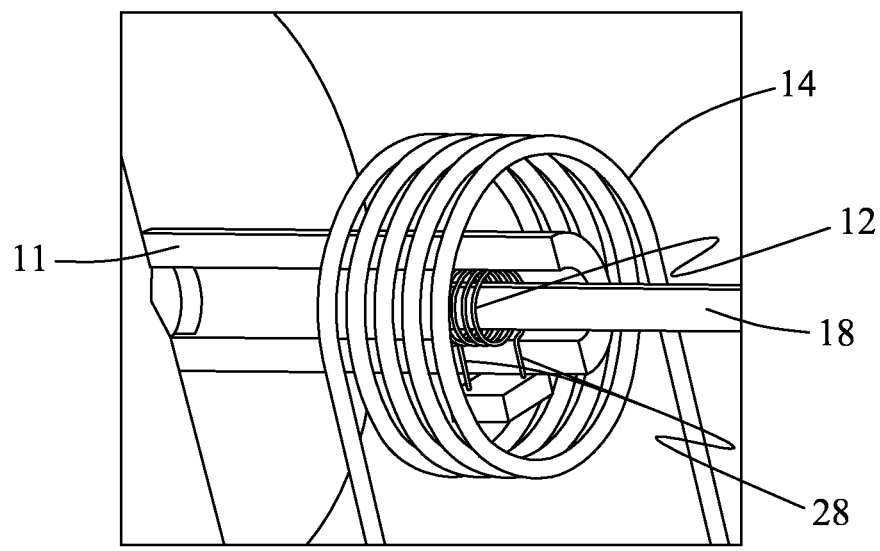
FIG. 2 shows an exemplary configuration for locking of inner RF coil 12 within resonator support 11.

FIG. 2 shows one exemplary configuration for positioning and locking RF coil 12 within resonator support 11. In the figure, slots 28 are introduced into the wall of support 11 that serve to lock respective ends of RF coil 12 into place. RF coil 12 is placed inside outer RF coil 14 such that inner RF coil 12 inductively couples with RF coil 14. When locked into position in slots 28, RF coil 12 is properly positioned and aligned around the exterior surface of sample tubes when introduced into the rotor. Number of slots 28, position or location of slots 28 within resonator support 11, and the specific mode of locking or locking configuration for RF coil 12 are not intended to be limited. For example, when a volume or quantity of sample increases or decreases, the size of sample tube 18 also increases or decreases. In these instances, switchable plug 8 to which LC resonator 10 and inner RF coil 12 attach may be easily switched with an inner RF coil 12 of a larger or smaller diameter, or larger and shorter length, to accommodate the change in sample quantity, volume, or size. No limitations are intended.

Sample Tubes

Sample tubes 18 used in concert with embodiments of the present invention are constructed of non-metallic and non-magnetic materials including, but not limited to, e.g., glass (e.g., Kimble Glass, Inc., Vineland, N.J., USA), ceramics including, e.g., zirconia ($ZrO_2$), $Al_2O_3$, MgO, CaO, $Y_2O_3$; combinations of these materials; and machinable plastics including, e.g., chlorotrifluoroethylene (e.g., KEL-F®, 3M Company, St. Paul, Minn., USA), polyether ether ketone polymers (e.g., PEEK®, Victrex USA, Inc., West Conshohocken, Pa., USA), polyimide-based polymers (e.g., VESPEL®, Dupont, Wilmington, Del., USA), polyamide-imide polymers (e.g., TORLON®, Solvay Advanced Polymers, L.L.C., Alpharetta, Ga., USA), or like plastics. Since sample spinning rates are low, no special seals (e.g., end caps) are required to contain and seal samples within the sample tubes. In typical operation, tube openings can be wrapped with, e.g., TEFLON® tape, or another tape material. No release of fluid or tissues occurs due to the slow spin rate.

Sample Volumes, Sizes, and Quantities

Slow-MAS probe 100 is designed to allow varied quantities of biological tissue samples or varied volumes of biofluids to be analyzed in a single probe. "Large" refers to a sample size or volume greater than about 100 mg. "Small" refers to a sample size or volume of about 3 mg or less. "Low" refers to a sample size or volume of about 10 mg or less. Probe 100 is ideally suited for samples of a small size (e.g., a few mg, i.e., about 3 mg or less), or a low volume sample of biological tissue (e.g., less than 10 mg). Samples may be of a homogeneous type or a non-homogeneous type. "Homogeneous" refers to non-ordered samples where the internal structure of the sample, including the shape, looks the same from different directions in terms of the magnetic susceptibility distributions. "Non-homogeneous" refers to ordered samples where the internal structure, including the shape, looks different from different directions in terms of the magnetic susceptibility distributions. The NMR probe of the present invention provides high-resolution NMR spectra and high sensitivity metabolic profiling of both types of samples. Slow-sample spinning avoids fluid leakage and thus maintains the integrity of the biological sample. The slow-MAS method is non-invasive, or minimally invasive, and also is safe for working with hazardous biological samples. In some embodiments, the probe analyzes biological tissue samples with volumes as low as 0.2 $mm^3$ (μL) (200 nanoliters) (0.2 mg). In some embodiments, the probe analyzes biological tissue samples with volumes up to about 1 $cm^3$ (mL). In some embodiments, the probe analyzes biological tissue samples with volumes greater than about 1 $cm^3$ (mL). In some embodiments, the probe analyzes biological tissue samples with volumes less than or equal to about 1 μL. In some embodiments, the probe analyzes biological tissue samples of a quantity less than about 0.2 mg and greater than about 1000 mg. In some embodiments, the tissue sample includes a mass up to about 1 gram or greater or a volume up to about 1 $cm^3$ (1 mL) or greater. No limitations are intended.

In some embodiments, probe 100 analyzes biological fluid samples of a quantity between about 0.2 mg (0.2 μL) and about 10 mg (10 μL). Standard liquid state NMR metabolomics can efficiently measure biofluids with volumes or masses larger than about 10 mg. Therefore, slow-MAS is not necessary for metabolic profiling of biofluids when volumes are larger than about 10 μL or masses are above about 10 mg. However, slow-MAS is extremely useful for analysis of very small biofluid samples, e.g., masses less than about 10 mg or volumes less than about 10 μL.

In various embodiments, sample tube 18 can rotate smoothly even when it extends beyond the length of outer RF coil 14 if the sample is of a small quantity below about 100 mg, or a low quantity below about 10 mg, or less. However, when the sample quantity becomes large or otherwise exceeds a selected weight limit (i.e., above about 100 mg or more), the uneven and heavy sample positioned at the end of the sample tube 18 can cause vibration in sample tube 18 when sample tube 18 is rotated due to insufficient bearing support. Eliminating vibration also facilitates the study of nanoliter-sized samples because sample tube 18 can be perfectly aligned with inner RF coil 12. In some embodiments, a clearance of about 0.05 mm between sample tube 18 and RF coil 12 improves the filling (fill) factor and thus the NMR sensitivity. However, clearance is not intended to be limited thereto.

Ability of probe 100 to analyze samples of a nanoliter quantity permits metabolic changes in single small laboratory animals to be investigated over a continued or long period of time using minimally invasive blood and tissue biopsy samples. And, ability of probe 100 to also analyze milliliter quantities of sample, or volumes up to, or greater than, 1 $cm^3$ (mL) allows minimally destructive studies and investigations to be performed on, e.g., larger-sized biological tissues, whole organs, and intact biological objects (e.g., live insects).

In some embodiments, biofluids with volumes less than about 1 uL can be analyzed. In some embodiments, biofluids with a mass above about 0.2 mg or a volume above about 200 nL can be analyzed.

In some embodiments, probe 100 can be used to analyze an intact and/or live animal, or a live bug or insect, continuously. The term "continuously" means an analysis time of up to about 3 days or more.

Setting Magic Angle

Figure 3:
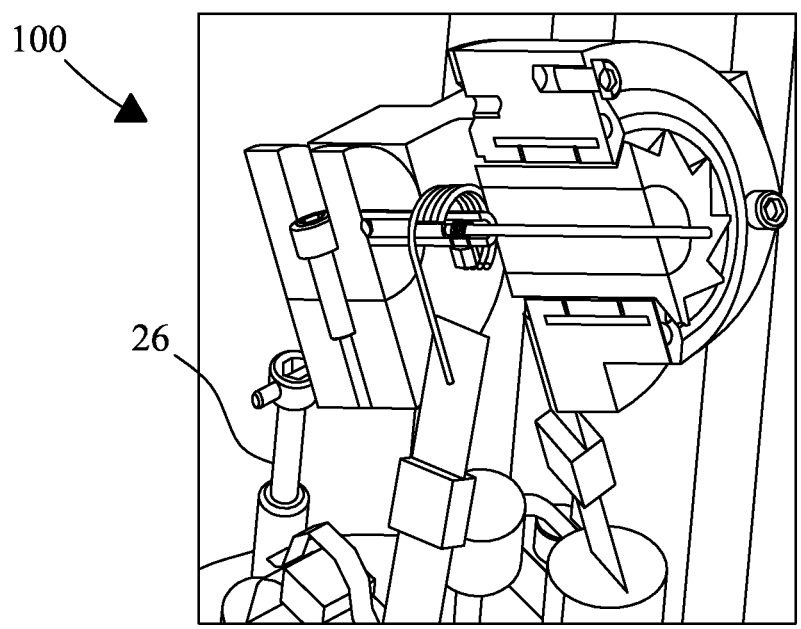
FIG. 3 shows an exemplary magic angle incline component 26.

FIG. 3 shows an exemplary incline adjustment component 26 for adjusting magic angle for MAS probe 100. In the figure, incline adjustment component 26 is positioned at one end of MAS probe 100, but location is not limited thereto, as will be appreciated by those of ordinary skill in the art.

Figure 4A:
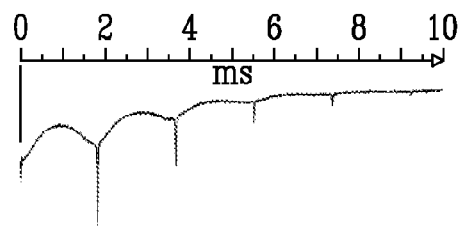
FIGS. 4a-4c show a process for setting the magic angle for the slow-MAS NMR probe system.
Figure 4C:
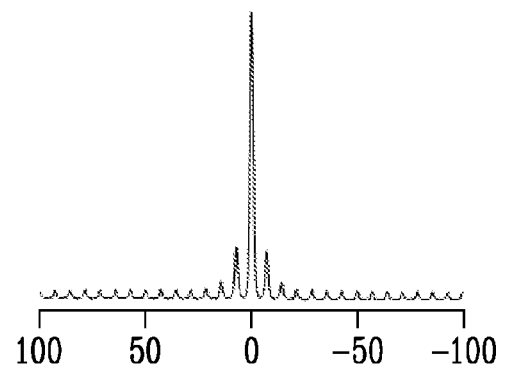
Figure 4B:
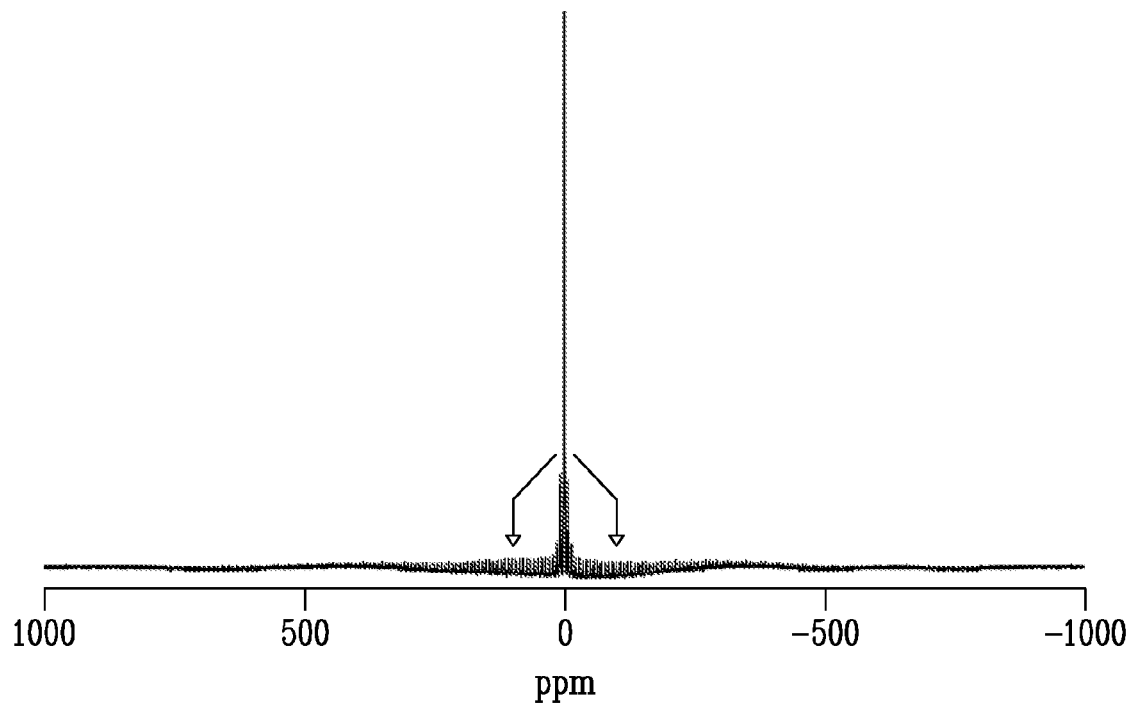

FIGS. 4a-4c illustrate the process for accurately setting the magic angle of the slow-MAS NMR probe 100. Solid kBr may be used to set the magic angle in a process similar to that performed for fast magic angle spinning experiments involving solids. In one embodiment, the process includes removing switchable inner RF coil plug (insert) 8, replacing sample tube 18 with a glass tube (e.g., 7.5 mm OD and 5 mm ID) containing a quantity (e.g., about 200 mg) of kBr solid. The kBr solid is rotated at a spinning rate of, e.g., 500 Hz. The magic angle is then set by returning the frequency of outer RF 14 circuit to the $^{79}$Br frequency (e.g., 75.15 MHz on a 300 MHz NMR spectrometer) in concert with the variable tuning and matching capacitors (not shown) coupled to the outer RF circuit. FIG. 4a shows the free-induction decay (FID) signal of $^{79}$Br obtained in a single scan, along with the associated train of rotational echoes. The magic angle is reached when the number of rotational echoes is maximized in the FID at the selected spinning rate (here 500 Hz). FIG. 4b shows the Fourier transformation of FIG. 4a. FIG. 4c is a plot showing the horizontally expanded spectral range of FIG. 4b, which identifies the point at which the magic angle is reached, i.e., when the number of sample spinning sidebands is maximized.

FIGS. 5a-5c shows another embodiment of a slow Magic Angle Spinning (MAS) Nuclear Magnetic Resonance (NMR) probe 100 of a dual-bearing design for metabolomics profiling of tissues and biofluids samples. FIG. 5a shows an expanded view of slow-MAS NMR probe 100. Probe 100 includes an enhanced probe (stator) body 2, MAS rotor 6, dual gas-driven bearing systems 4 and 5 positioned at respective ends of sample rotor 6 to provide rotation stability when spinning large quantities or volumes of sample of about 100 mg or more. Probe 100 also includes a switchable plug 8 with a switchable LC resonator 10. LC resonator 10 includes an inner (first) static RF coil 12 with capacitors 15 attached as described previously above. Inner RF coil 12 is placed inside switchable coil support 11. Inner RF coil 12 is constructed of magnetic susceptibility-matched wire as described previously above. LC resonator 10 in switchable coil support 11 inserts into switchable plug 8. Switchable plug 8 with LC resonator 10 attached in switchable coil support 11 inserts into probe (stator) body 2. Inner RF coil 12 is static meaning sample tubes 18 rotate with MAS rotor 6 while inner RF coil 12 remains stationary. In operation, inner RF coil 12 optimizes the B$_0$ field homogeneity while sample tube 18 spins. In various embodiments, switchable plug 8 into which LC resonator 10 inserts may be switched out with another switchable LC resonator 10 that includes a larger or smaller RF coil 12 with a larger or smaller internal diameter (I.D.) to accommodate sample tubes 18 with larger or smaller diameter dimensions to accommodate differing volumes or quantities of sample.

When assembled into probe 100 (stator) body 2, RF coil 12 couples inductively with an outer static RF excitation/receiver coil (resonator) 14 positioned within probe (stator) body 2. Inner RF coil 12 maximizes the "filling factor" between sample tube 18 which contains the sample and inner RF-Coil 12. Increasing the fill factor enhances the NMR sensitivity of the sample analysis. LC resonator 10 containing inner RF coil 12 and capacitors 15 may be removed when the quantity or volume of sample is sufficient to overcome sensitivity limitations resulting from a limited sample size, as described previously herein.

Probe 100 further includes a sample tube adaptor 16 of an adjustable size that holds sample tubes 18 of varied dimensions containing varied quantities and volumes of samples in sample tubes 18 when sample tubes 18 are inserted into sample rotor 6. Sample rotor 6 includes a number of turning fins 7 that in concert with a drive gas spin rotor 6 when rotor 6 is assembled with bearings 4 and 5 in probe (stator) body 2.

Probe 100 may include an optical detection system 20 that can be used for detecting and synchronizing position of rotor 6 and for accurately determining spinning rate of rotor 6. In some embodiments, probe 100 may include two optical supports (22, 30) each with respective optical detection channels (24, 32) that mount an optical fiber (not shown) configured as optical transmitters and receivers. In some embodiments, optical detection channel 24 synchronizes rotor 6 to a fixed position. For example, mounting support 22 with optical detection channel 24 when assembled into stator body 2 may be positioned, e.g., at the trailing side of bearing 4 to detect a fixed mark located, e.g., on the surface of sample rotor 6 in front of RF coil 14 to synchronize position of rotor 6, as detailed further in reference to FIG. 6 below. In some embodiments, mounting support 30 with optical detection channel 32 when assembled in stator body 2 may be positioned, e.g., behind RF coil 14 to accurately control the sample spinning rate of rotor 6. For example, a multiple of six (i.e., 6) black and six (6) white, evenly-spaced marks may be positioned around the rotor 6 circle, and may be used to accurately count the sample spinning rate, described previously in reference to FIG. 1. No limitations are intended. For example, all optical detection configurations involving synchronization and sample spinning rate as will be implemented by those of ordinary skill in the art in view of this disclosure are within the scope of the invention.

FIG. 5b shows a perspective view of switchable plug 8 with LC resonator 10 attached. LC resonator 10 inserts into resonator support 11. In some embodiments, resonator support 11 is detachable. In some embodiments, resonator support 11 can be an integrated part of switchable plug 8. Switchable plug 8 is designed to allow use of switchable LC resonators 10 containing RF coils 12 with capacitors 15 attached that includes larger or smaller internal diameters (I.D.) to accommodate sample tubes 18 with larger or smaller diameter dimensions to contain differing volumes or quantities of sample. Inner RF coil 12 is constructed of magnetic susceptibility-matched wire, and is wound and placed inside switchable coil support 11. RF coil (resonator) 12 is static, meaning sample tubes 18 rotate with MAS rotor 6 while RF coil 12 remains stationary. The static inner RF coil 12 optimizes the B$_0$ field homogeneity while sample tube 18 spins.

FIG. 5c shows a perspective view of slow-MAS NMR probe 100 including dual bearings in an assembled form. The instant design allows large biological objects above about 100 mg or volumes of about 1 cm$^3$ or more to be analyzed, simply by removing switchable LC resonator 10, with its coupled RF coil 12 and capacitors 15, described previously in reference to FIG. 5a. In some embodiments, samples are intact samples. In some embodiments, samples are not intact samples. In the figure, sample tube 18 containing a sample is fixed inside adaptor 16 and positioned and supported in concert with bearings 4 and 5 with rotor 6. Rotor 6 includes turning fins 7 that turn rotor 6 in concert with gas-driven bearings 4 and 5. In the figure, switchable plug 8 is attached to switchable LC resonator 10 that includes inner RF coil 12. Switchable plug 8, when inserted into probe (stator) body 2, aligns LC resonator 10 such that static inner RF coil 12 couples inductively with outer RF excitation/receiver coil (resonator) 14 within probe (stator) body 2. Mounting support 22 with optical detection channel 24 when assembled in stator body 2 may be positioned, e.g., in front of RF coil 14 at the trailing side of bearing 4 to detect a fixed (e.g., black) mark located, e.g., on a back end of sample rotor 6 to synchronize position of rotor 6 in concert with the slow-MAS pulse sequence. In an exemplary implementation, a single black mark may be used to trigger the position of rotor 6, detailed further herein in reference to FIG. 6 below. Mounting support 30 with optical detection channel 32, may be positioned when assembled in stator body 2, e.g., behind RF coil 14 to accurately control the sample spinning rate of rotor 6 in concert with counting the sample spinning rate of rotor 6. For example, rotor 6 may be marked evenly around the circle perimeter of rotor 6 with, e.g., 12 evenly-spaced black and white marks that ensure a spin rate accuracy of at least about 0.083 is reached.

In some embodiments, outer RF coil 14 is of a 2-3 turn coil design. In some embodiments, outer coil 14 may be composed of a flat wire with an I.D. of about 11 mm that is tuned at the $^1$H Larmor frequency of 500 MHz. The inner RF coil 12 is of a switchable design that allows it to be easily and quickly exchanged with a larger or a smaller diameter coil that optimizes sensitivity and performance of the probe 100. The inner RF coil (resonator) 12 may be made of a magnetic susceptibility-matched wire, and a fixed-value capacitor such that the isolated LC circuit resonates near 500 MHz. The inner RF coil 12 is wound inside a plastic support 11 that is attached to the switchable plug 8 (FIG. 5b). Inner RF coil 12 maximizes the filling factor, i.e., for maximizing the signal-to-noise (S/N) ratio when tissue samples of a small quantity or low volume are analyzed. In some embodiments, capacitors 15 attached to RF coil 12 in LC resonator 10 are non-magnetic chip capacitors (e.g., American Technical Ceramics Corp., Huntington Station, N.Y., USA) with dimensions of 1.5 mm×1.2 mm×1.0 mm. Since the LC resonator 10 circuit is an isolated resonator 10 (i.e., no other electric wires attach to the LC circuit), LC resonator 10 can be easily switched, replaced, or exchanged to include a range of RF coils 12 with larger or small I.D. to accommodate a range of sizes of sample tubes 18 and thus varied quantities and volumes of samples. In some embodiments, when sample size is sufficiently large (above about 40 mg or more) and sensitivity is not a problem, switchable plug 8 containing the isolated LC resonator 10 (containing inner RF coil 12 and capacitors 15) can be removed so that biological tissue samples of a large size above about 1000 mg or more can be profiled at a stable/smooth sample spinning rate in concert with bearings 4 and 5.

In some embodiments, a best S/N value for slow-MAS metabolic profiling is obtained for low volume/low quantity samples (e.g., nanoliter sized biological tissue samples or nanoliter sized biofluids) by employing both LC resonator 10 circuit (containing inner RF coil 12 and capacitors 15) with outer RF coil 14 together and optimizing (i.e., maximizing) the performance of the inductively coupled RF circuit. In some embodiments, inner RF coil 12 may be of a coil scroll design that provides a low inductance and maximizes the $B_1$ field homogeneity for outer RF coil 14 if tuning to 500 MHz or greater becomes difficult, e.g., when large RF coils with an I.D. of about 8 mm or greater are employed. In addition, to optimize LC resonator 10, efficiency of the inductive coupling between outer RF coil 14 and inner LC resonator 12 is maximized, e.g., by adjusting the number of turns, length, width (O.D.) and inner dimension (I.D.) of outer RF coil 14. In some embodiments, inductively coupled inner RF coil 12 may be doubly-tuned so as to be capable of both $^1$H and $^{13}$C observation. No limitations are intended.

New Pulse Sequence for Slow-MAS Metabolomics Profiling

Figure 6:
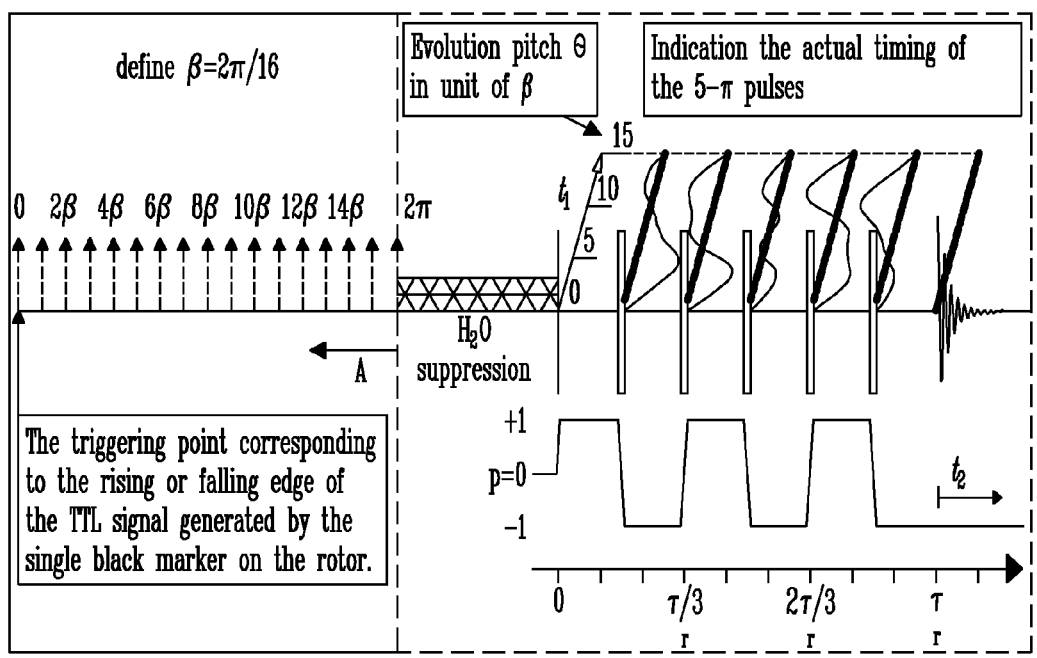
FIG. 6 shows a new $^1$H PASS sequence for rotor position and timing synchronization for metabolic profiling of ordered and non-ordered samples.

FIG. 6 shows a new pulse sequence based on $^1$H PASS that synchronizes both the rotor position and the timing for slow-MAS metabolic profiling of: 1) ordered (i.e., non-homogeneous) tissue samples (i.e., having both shape and structure) and 2) non-ordered (i.e., homogeneous) biofluid samples of varying size, quantity, and/or volume. Rotor position is synchronized with the pulse sequence for ordered biological samples using $^1$H PASS. In some embodiments, as an example, PASS-16 synchronization comprising sixteen evolutions increments/steps/pitches is used, but the synchronization approach is not limited thereto. $^1$H PASS requires a powder- (or gamma γ-) average, to obtain a high resolution $^1$H NMR spectrum that is free from magnetic susceptibility, chemical shift anisotropy, and/or weak homonuclear dipolar coupling induced line broadening.

For a biological tissue sample, the gamma γ-average is satisfied if the sample is homogeneous, e.g., naturally homogeneous or homogenized such that the sample is homogeneous. However, homogenization is undesirable because it is destructive to the tissue structure. Thus, for an ordered sample, the effect of gamma γ-averaging can still be met if the beginning of the pulse sequence is randomized relative to a fixed sample rotor position and a large number of accumulations (scans) greater than about 96 (depending on the degree of non-homogeneity) can be used for each PASS evolution increment, i.e., the so called evolution pitch (Θ). The relationship between gamma averaging and evolution pitch in PASS sequences is detailed, e.g., by Antzutkin et al. "Two-Dimensional Sideband Separation in Magic-Angle Spinning NMR", Journal of Magnetic Resonance, Series A115, pp. 7-19 (1995), incorporated herein in its entirety.

Problems associated with residual spinning sidebands for ordered samples is resolved if rotor position is synchronized. The synchronization time point is moved forward in time in exact synchrony with the increasing pitch (Θ) of the pulse sequence. Rotor position synchronization requires a precise control of the sample spinning rate. The slow-MAS probe of the present invention employs two optical channels (drives) to make this possible. Once rotor position synchronization is implemented, in addition to more targeted biological tissue/whole organ studies, non-invasive, slow-MAS metabolomics on small, live, highly ordered biological species can also be performed, e.g., insects and bugs of various sizes. This dual capability greatly expands metabolomics applications of slow-MAS.

As shown in FIG. 6, in the beginning of the $^1$H PASS rotation sequence (i.e., point A), the first evolution increment of the PASS-16 synchronization (i.e., denoted in the dotted box) is synchronized exactly one full rotation away, with the rotor position fixed, where the 5 π (pi) pulses are equally spaced within one rotor period and the corresponding pitch Θ=0. For the $2^{nd}$ evolution increment [i.e., Θ=1×(2π/16)], point "A" is synchronized to 15×(2π/16) rotations away from the fixed rotor position. Likewise for the $3^{rd}$ evolution increment, [i.e., Θ=2×(2π/16)], point "A" is synchronized to 14× (2π/16) rotations away from the fixed rotor position, and so on. At the end of the rotation sequence, the $16^{th}$ evolution increment [i.e., θ=15×(2π/16)], point "A" is synchronized to 1×(2π/16) rotations away from the fixed rotor position.

MATPASS is an alternative pulse sequence approach that may be employed for slow MAS that is based on the 5π Magic Angle Turning (MAT) approach described, e.g., by Hung et al. "On the magic-angle turning and phase-adjusted spinning sidebands experiments", Journal of Magnetic Resonance, 204, (2010), pp. 150-154 incorporated herein in its entirety. MATPASS sequences employ a linear time increment along the evolution dimension.

Sample Spinning Rates

The $^1$H PASS (phase-adjusted spinning sidebands) sequence approach facilitates non-destructive ex vivo studies of excised intact tissues and organs. $^1$H PASS requires relatively short measurement times (e.g., from a few minutes to less than an hour) and offers both high sensitivity and high spectral resolution. As an example, a sample spinning rotor with an inner diameter of 6 mm, the maximum centrifugal force introduced by spinning at sample spinning rates of 40, 80 and 160 Hz, respectively is only ~19, ~90 and ~360 times the gravitational force. Such a centrifugal force is considered safe to maintain sample integrity. In some embodiments, sample spinning rates up to 600 Hz are safe for maintaining cellular structure of, e.g., excised prostate tissues. In some embodiments, $^1$H PASS applied at a sample spinning rate of 160 Hz or less is preferred for ex vivo research on excised intact tissues/organs, where biologically relevant conditions are preserved, because fluids are easy maintained inside the tissue at slow sample spinning rates without fluid leakage.

High Resolution Slow-MAS $^1$H PASS Spectra

Low Quantity and Low Volume Samples

Figure 7A:
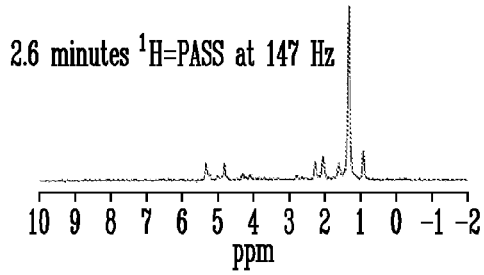
FIGS. 7a-7d show high-resolution slow-MAS $^1$H PASS spectra for a sample of excised mouse tissue.
Figure 7B:
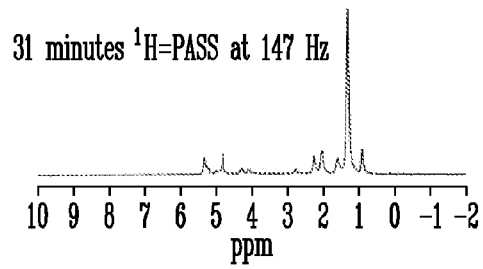
Figure 7C:
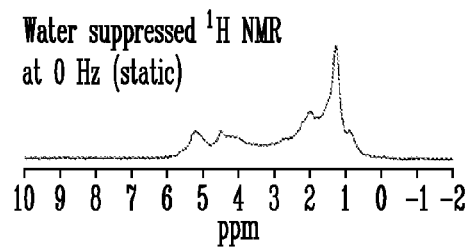
Figure 7D:
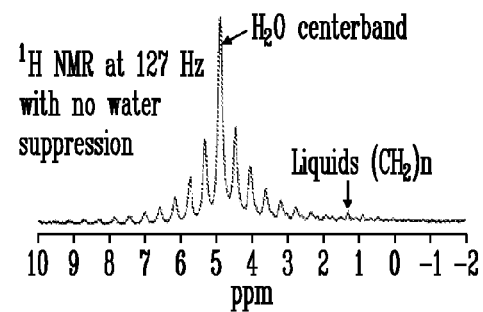

FIGS. 7a-7d show high-resolution slow-MAS $^1$H PASS spectra obtained on low quantities (~mg) and low volumes (~nL) of tissue. FIG. 7a shows a water-suppressed, $^1$H PASS spectrum acquired on a 200 nanoliter (0.2 mg or a volume of about 0.2 µL) sample containing excised mouse muscle acquired over a period of 2.6 minutes at a sample spinning rate of 147 Hz. For the experiment in FIG. 7a, the inner RF coil had an ID of 1.3 mm and a length of 2.7 mm. The volume of the coil was 3.58 µL. Filling factor for this experiment was 0.056 [0.2 µL divided by 3.58 µL]. In the figure, several major resolved peaks (mostly from lipids) are observed at about 0.89 ppm, 1.28 ppm, 1.57 ppm, 2.0 ppm, 2.2 ppm, 2.75 ppm, 4.05 ppm, 4.26 ppm and 5.3 ppm. With the inner RF coil (resonator) mounted, results show a water-suppressed, high resolution $^1$H PASS spectrum is acquired with a reasonable S/N on 200 nanoliters (about 0.2 mg) of muscle sample excised from a C57BL6 obese mouse using an acquisition time of as short as 2.6 minutes at a sample spinning rate of 147 Hz. FIG. 7b shows a water-suppressed $^1$H PASS spectrum on the same tissue sample in FIG. 7a. Data were acquired immediately after those in FIG. 7a using a longer acquisition time of 31 minutes at a sample spinning rate of 147 Hz. Major lipid peaks observed located at about 0.89 ppm, 1.28 ppm, 1.57 ppm, 2.0 ppm, 2.2 ppm, 2.75 ppm, 4.05 ppm, 4.26 ppm and 5.3 ppm, are confirmed. FIG. 7c shows a H$_2$O suppressed, static (no sample spinning) $^1$H NMR spectrum acquired immediately after the sample data presented in FIG. 7b were collected. As shown in the figure, without the use of $^1$H-PASS, peaks in the water-suppressed static spectrum overlap severely. FIG. 7d shows the $^1$H NMR spectrum for a muscle sample from the same obese mouse as those of FIGS. 7a-7c acquired at a sample spinning rate of 127 Hz using no water suppression. Data in the figure highlight the relative ratio of the H$_2$O-to-lipid signal. About 93% of the 0.2 mg muscle sample is water. In the figure, lipid content in the muscle of this obese mouse is about five times that of a regular C57BL6 mouse.

Results show RF performance of the slow MAS probe on small samples is remarkable. A signal-to-noise (S/N) enhancement of ~22 was obtained using inner RF coil on about 1 mg of mouse muscle sample based on the lipid signal in the sample. Further, spectral resolution obtained with $^1$H PASS is better than that obtained in a conventional magic angle coil spinning (MACS) approach on a 0.3 mg bovine muscle tissue (where lipid to H$_2$O ratio is about 1/3) at a sample or coil spinning rate of 3 kHz on a 500 MHz NMR spectrometer (11.7 T field). For example, in a conventional MACS spectrum, the 1.57 ppm peak is heavily overlapped with the main lipid peak located at about 1.28 ppm, while the present invention provides a well-resolved peak at the 1.57 ppm location, as demonstrated in FIGS. 7a-7b. Sensitivity of the slow-MAS $^1$H PASS approach on 0.2 mg is also comparable to that obtained with a conventional MACS approach. And, the S/N value obtained in the 2.6 minute (156 sec) $^1$H PASS spectrum in FIG. 7a on the 0.2 mg of mouse muscle is comparable to that obtained in a 33 sec MACS experiment run on 0.3 mg of bovine muscle tissue. While filling factor was not optimized (an optimum filling factor of 0.2 was possible) (and thus sensitivity was not maximized) for experiments described for FIGS. 7a-7b, at the filling factor selected, sensitivity achieved at a spinning rate of 147 Hz using the present invention is at least comparable to, or better than, the conventional state-of-the-art.

Because S/N is proportional to the square root of the filling factor, the filling factor can be increased to about 0.2 by raising the gain in S/N by another factor of 2. With a factor of 3.4 gain in S/N compared to the experiment of FIG. 7a, one can presumably acquire a slow-MAS $^1$H PASS experiment on 0.2 mg of regular mouse muscle sample, or other tissue sample types, in a few minutes.

High Resolution $^1$H PASS Spectra

Large Quantity and/or Large Volume Samples

Figure 8A:
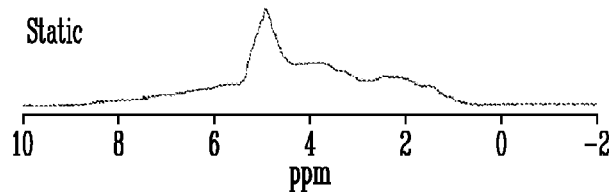
FIGS. 8a-8b show high-resolution slow-MAS $^1$H PASS spectra for a milliliter quantity of excised mouse brain tissue sample.
Figure 8B:
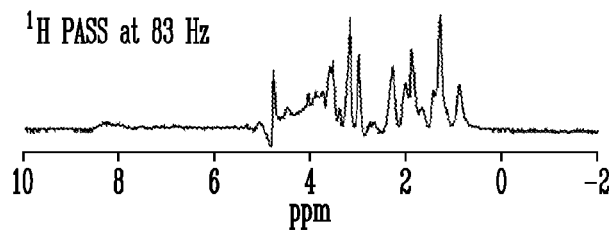

Feasibility of using the slow-MAS metabolomics probe in concert with slow-MAS $^1$H PASS synchronization for analysis of large sample volumes containing biological tissues is demonstrated. FIGS. 8a-8b compare a conventional $^1$H NMR spectrum with H$_2$O suppression applied to the high-resolution, water-suppressed, slow-MAS $^1$H NMR PASS spectrum performed on mouse brain tissue at 300 MHz obtained with probe 100. For these experiments, probe 100 was configured with inner RF coil 12 removed. The sample contained three intact brains excised from mice. A glass sample tube 18 was used. Sample volume was 1.005 cm$^3$. Sample weight was about 1005 mg. FIG. 8a shows the static spectrum obtained by conventional $^1$H NMR with H$_2$O suppression applied. In the conventional spectrum (FIG. 8a), due to magnetic susceptibility variations across the three brains, and the magnetic susceptibility difference between the glass tube material and that of the tissue inside the sample tube, severe line broadening is observed, resulting in a featureless static spectrum. FIG. 8b shows a high resolution $^1$H NMR spectrum obtained with the slow-MAS probe of the present invention using an $^1$H PASS sequence at a sample spinning rate of 83 Hz, acquired using sixteen evolution steps, each with 96 scans and a recycle delay time of 1 second. As shown in the figure, many metabolites are now resolved due to the enhanced spectral resolution provided by the probe.

High Resolution $^1$H PASS Spectra

Low Volume Biological Fluid Samples

The utility of a slow-MAS metabolomics probe in concert with slow-MAS $^1$H PASS for analysis of samples containing low volumes of biological fluids has been demonstrated. FIGS. 9a-9b compare a conventional $^1$H NMR spectrum to a high-resolution, water-suppressed, slow-MAS $^1$H PASS spectra of a biofluid (2.5 µL mouse urine) sample collected at 300 MHz with probe 100. FIG. 9a is a conventional static spectrum of the sample obtained with conventional $^1$H NMR.

Due to the differences between the magnetic susceptibility of the tube material and that of the fluid, severe line broadening was observed. FIG. 9b is a high resolution, water-suppressed, slow-MAS $^1$H PASS spectrum obtained on the same 2.5 μL urine sample at a sample spinning rate of 80 Hz. The insets show spectral regions expanded vertically by a factor of 4 times. Results show a high quality, high resolution metabolite spectrum is obtained. For example, the line width of the most intense peak at 3.286 ppm is only about 0.8 Hz. Spectral resolution is similar to that obtained with human urine when the sample volume is sufficiently large for standard NMR metabolomics analysis. Results show the 0.8 Hz line width is also significantly narrower than observed in conventional probes designed for ultra-small-liquid-sample detection. In short, the slow-MAS approach has been demonstrated to be ideally suited for analyses of biofluids when sample volumes are limited (e.g., less than about 2 μL) and when conventional commercial liquid state NMR metabolomics probes cannot profile.

Applications

The present invention can be used to study various tissues and biochemical processes associated with disease progression including, but not limited to, e.g., cancer cells, cervical tissues, breast cancer tissues, prostate tissue, brain glioma/tumors, neurological disorders, liver tissues, gastrointestinal biopsies, testicular tissue, renal tissues, and other tissues and samples, and processes involving evaluating effects of various biochemical therapies. Applications also include, but are not limited to, e.g., metabolic profiling on nanoliter-sized tissue samples and biofluid samples. Examples include, e.g., biological tissues or blood samples collected in repeated, "in-life" sampling of small laboratory animals (e.g., mice), and even human patients. Sample volumes can be as small as 200 mL. Sample volumes on regular biological tissues can be as large as 1 cm$^3$ or more with analysis times as short as a few minutes using a single probe, including, e.g., analyses of live small biological objects such as live bugs or insects.

While a number of embodiments of the present invention have been shown and described, it will be apparent to those skilled in the art that many changes and modifications may be made without departing from the invention in its broader aspects. The appended claims are therefore intended to cover all such changes and modifications as fall within the spirit and scope of the invention.

What is claimed is:

1. A slow Magic Angle Spinning (MAS) Nuclear Magnetic Resonance (NMR) device, comprising:
a sample spinning probe configured to rotate a sample inclined at a magic angle with respect to the B$_0$ magnetic field at a slow spinning rate, the probe includes a rotor with a sample tube adapter configured to hold a sample tube of varied dimensions containing a sample of a variable size, quantity, and/or volume in the rotor when introduced into a support body of the probe; and
a switchable LC resonator comprising a first static RF coil coupled to one or more capacitors that defines an RF circuit, the LC resonator attaches to a switchable plug component that inserts into the support body of the probe, the LC resonator when inserted in the support body inductively couples the first static RF coil with a second static RF coil disposed therein that enhances the sample filling factor between the sample and the first RF coil and the sensitivity of sample analyses therein.

2. The device of claim 1, wherein the probe is configured to rotate the sample at a slow spinning rate defined below about 500 Hz.

3. The device of claim 1, wherein the first static RF coil circumvolves the sample tube in the rotor.

4. The device of claim 1, wherein the switchable LC resonator and first static RF coil are switchable with an LC resonator and static RF coil of a smaller or larger width dimension that accommodate a sample tube with a smaller or larger width dimension in the rotor.

5. The device of claim 1, wherein the probe includes a single rotation bearing.

6. The device of claim 1, wherein the probe includes dual rotation bearings.

7. The device of claim 6, wherein the probe includes a first rotation bearing disposed in the support body in front of the second RF coil where into which the sample tube inserts into the rotor.

8. The device of claim 6, wherein the probe includes a second rotation bearing disposed at the rear of the second RF coil where the switchable plug attached to the LC resonator and first static RF coil insert into the support body of the probe.

9. The device of claim 1, wherein the probe includes an optical detection system comprising a first optical detection channel on a support with a first optical fiber that counts and determines spinning rate of the rotor.

10. The device of claim 9, wherein the first optical fiber determines spinning rate with a selected number of counting marks disposed on a surface of the rotor during rotation thereof.

11. The device of claim 10, wherein the number of counting marks on the surface of the rotor is a multiple of 6 below and including 24.

12. The device of claim 1, wherein the optical detection system includes a second optical detection channel on a support with a second optical fiber that synchronizes a slow MAS pulse sequence to a specified rotor position.

13. The device of claim 12, wherein the second optical fiber synchronizes rotor position with a $^1$H Phase Adjusted Spinning Sidebands (PASS) pulse sequence that includes a rotor position synchronization sequence segment therein.

14. The device of claim 13, wherein the second optical fiber synchronizes the rotor position with optical triggering based on a single fixed mark disposed on a surface of the rotor during rotation of the rotor.

15. The device of claim 13, wherein the pulse sequence suppresses magnetic susceptibility induced line broadening effects for the sample at the slow spinning rate.

16. The device of claim 13, wherein the pulse sequence controls timing of pulses delivered by the pulse sequence.

17. The device of claim 1, wherein the sample tube adapter and/or switchable plug and/or a support of the switchable coil are composed of a machinable plastic.

* * * * *